United States Patent [19]

Trubisky

[11] 4,241,446
[45] Dec. 23, 1980

[54] APPARATUS FOR PERFORMING SINGLE ERROR CORRECTION AND DOUBLE ERROR DETECTION

[75] Inventor: Leonard G. Trubisky, Scottsdale, Ariz.

[73] Assignee: Honeywell Information Systems Inc., Phoenix, Ariz.

[21] Appl. No.: 952,025

[22] Filed: Oct. 16, 1978

[51] Int. Cl.² .................. G06F 11/12; G11C 29/00
[52] U.S. Cl. .................................. 371/37; 371/38
[58] Field of Search .................. 340/146.1 AL; 235/303.2, 312

[56] References Cited

U.S. PATENT DOCUMENTS

| | | | |
|---|---|---|---|
| 3,825,893 | 7/1974 | Bossen et al. | 340/146.1 AL |
| 3,949,208 | 4/1976 | Carter | 340/146.1 AL |
| 3,982,226 | 9/1976 | Bunker et al. | 340/146.1 AL |
| 4,139,148 | 2/1979 | Scheuneman et al. | 340/146.1 AL |

OTHER PUBLICATIONS

Motorola Semiconductors Brochure, Modules MC8500P and MC8501P, Cyclic Redundancy Check Character Generator and Error Pattern Register, 1973.

*Primary Examiner*—Charles E. Atkinson
*Attorney, Agent, or Firm*—T. W. Demond; William W. Holloway, Jr.; Ronald T. Reiling

[57] ABSTRACT

This relates to an apparatus for performing single error correction, double error detection of binary words, each section of the apparatus processing one byte of raw data. Each section includes first logic means for producing a first plurality of intermediate sector matrix parity outputs. A second logic means receives one of the first plurality of intermediate sector matrix parity outputs and a second plurality of intermediates matrix parity outputs from other sections and generates therefrom a syndrome signal. A third logic means receives this syndrome signal and syndrome signals from other sections and generates therefrom the corrected data bits.

5 Claims, 8 Drawing Figures

APPARATUS FOR PERFORMING SINGLE ERROR CORRECTION AND DOUBLE ERROR DETECTION

BACKGROUND OF THE INVENTION

1. Field of the Invention

This invention relates generally to an apparatus for performing single-error correction and double-error detection (SEC-DED) and, more particularly, to a large scale integrated circuit which may be used in multiples to implement SEC-DED. Eight such large scale integrated circuit parts in combination with eight MSI 8-bit parity generators of the type which are commercially available are sufficient for the generation, correction and detection of an 80-bit code word (72 bits of data+8 check bits).

2. Description of the Prior Art

An industry need exists for a large scale integrated circuit implementation of a double-error detecting, single-error correcting (distance four code) logic network. Of particular importance is low propagation delay, with a goal of no more than 60 nsec added to the memory access time for the error detection and correction (EDAC) function. To be marketable, the network should be partitioned into no more than two part types with no more than forty pins per package. It is assumed that transistor-transistor-logic (TTL) compatibility is necessary, although interconnections between packages might employ higher levels as required.

Motorola has approached a similar problem by developing, as part of their MECL 10,000 series medium scale integration parts, an MC10162 and MC10193 which perform an EDAC function. This arrangement, however, cannot handle 9-bit bytes and requires additional circuitry to decode the syndrome, correct each data bit and generate parity.

SUMMARY OF THE INVENTION

It is the object of the present invention to provide a large scale integrated circuit (LSI) implementation of a single-error correction and double-error detection (distance four code) logic network.

It is further object of the invention that the SEC-DED implementation provide a low propagation delay; i.e. no more than 60 nsec added to the memory access time for the EDAC function.

It is a further object of the invention that the SEC-DED be partitioned into no more than two part types.

Finally, it is the object of the invention that the SEC-DED implementation be compatible with transistor-transistor-logic (TTL).

According to a broad aspect of the invention there is provided an apparatus for performing error correction and detection of binary words wherein each section of said apparatus processes one byte of data, wherein each section comprises:

first means for receiving data;

second means coupled to said first means for producing a first plurality of intermediate sector matrix parity outputs;

third means coupled to said second means for receiving one of said first plurality of outputs and a second plurality of intermediate matrix parity outputs from other sections and generating therefrom a syndrome signal; and fourth means coupled to said first and third means for receiving said syndrome signal and a plurality of syndrome signals from other sections and generating therefrom the corrected data bits.

The above and other objects of the present invention will be more clearly understood from the following detail description taken in conjunction with the accompanying drawings in which:

DESCRIPTION OF THE PREFERRED EMBODIMENT

Figure 1:
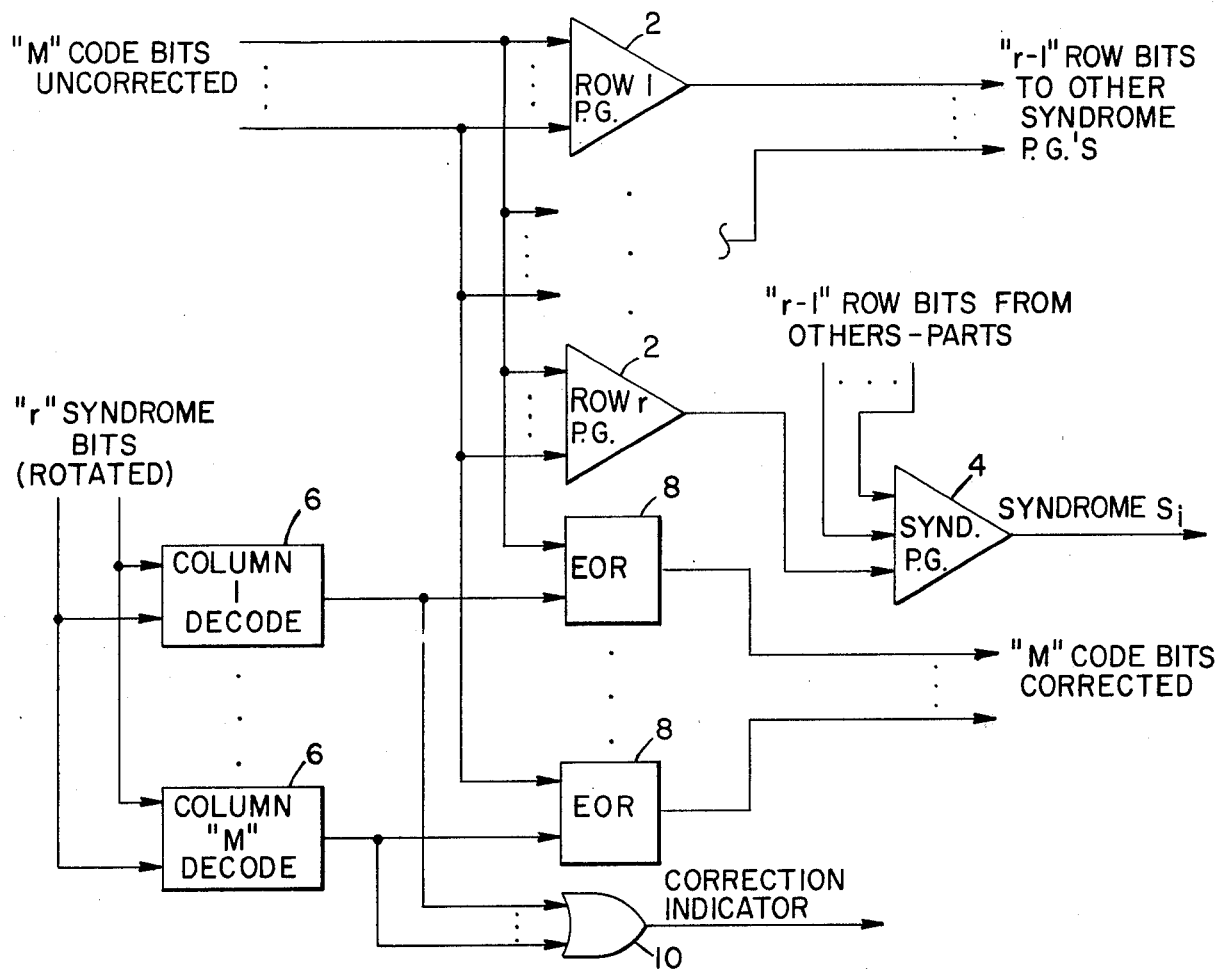
FIG. 1 is a functional diagram of a large scale integrated S-part.

While a detailed treatment of error detection and correction techniques may be found in Hamming, "Error Detecting and Error Correcting Codes" Bell System Technical Journal, Volume 29, 1950, pages 147–160, the following discussion is believed necessary in order to provide an understanding of the present invention. Standard coding theory notation will be used; i.e., k represents the number of data bits in a code word, r represents the number of check bits in the code word, and n represents the total number of bits in a code word (n=k+r).

According to Hamming, a single error correcting (distance 3) code must satisfy:

$$2^r \geq k+r+1; \qquad \text{(Equation 1)}$$

while a single error correcting with double error detection (distance 4) code must satisfy:

$$2^{r-1} \geq k+r \qquad \text{(Equation 2)}$$

The minimum number of check bits for up to 247 data bits is given in Table 1 for distance 3 and distance 4 codes.

TABLE 1

| data bits | r check bits | |
|---|---|---|
| k | distance 3 | distance 4 |
| 1 | 2 | 3 |
| 2–4 | 3 | 4 |
| 5–11 | 4 | 5 |
| 12–26 | 5 | 6 |
| 27–57 | 6 | 7 |
| 58–120 | 7 | 8 |
| 121–247 | 8 | 9 |

Seventy-two bits of data therefore require 8 check bits or a code word having a total of 80 bits.

The value of the check bits needed for single error correction may be derived by constructing a Hamming parity matrix (H-matrix) which consists of n columns and r rows. Each column is associated with one bit of the code word. The entries of the H-matrix correspond to coefficients of the code word bits and are limited to a value of 0 or 1. Each row then defines an equation which is the module-2 summation of the row coefficients times the associated code word bit. The resulting column vector formed by this summation is denoted as the syndrome. If all bits of the code word are correct, then the syndrome should be zero. If a single bit of the code word is in error, then the syndrome will be equal to the column of coefficients in the H-matrix corresponding to the erroneous bit. Similarly, the r row equations may be used to define the value of the r check bits on generation of the code word.

According to Hamming, the rules for constructing the values of the H-matrix for single error correction are very simply two: (1) there are to be no all zero columns; and (2) every column must be distinct.

The ordering of the columns (or equivalently the assignment of code word bits to columns) is completely arbitrary and therefore a wide variety of matrix assignments are possible.

For double error detection as well as single error correction (i.e. a distance of 4 code) a third condition is placed on the construction of the H-matrix. This, according to Hamming, is that one row of the H-matrix be all ones. That is, one check bit is to represent an overall parity check. Others since that time have shown that this rule of Hammings can be replaced by the following rule: (3) each column of the H-matrix must contain an odd number of 1's for a distance 4 code.

The most obvious advantage of the odd column rule over Hamming's all 1's rule is that it eliminates the need for a parity tree needing all n-bits of a code word.

Using the above three rules, an H-matrix for SEC-DED can be defined. The problem which remains is how to choose one of the many possible H-matrix arrangements which will produce the most efficient hardware implementation.

A sector matrix (S-matrix) is defined as consisting of m columns and r rows. Again, r is defined as the number of check bits while n is defined as the nearest integer equal to or greater than the ratio of n/r.

For n=80 (k=72 data bits+r=8 check bits) the size of the S-matrix is m=10 column by 8 rows. The same size matrix would be necessary for an n of 79, 78, 77, 76, 75, 74 or 73.

Columns of 1's and 0's are assigned to the S-matrix observing the followings rules: (1) each column of the S-matrix must contain an odd number of 1's; and (2) each column of the S-matrix must be chosen such that the row values of the column can be rotated from 1 to r−1 positions with no duplication of any of the resulting column patterns or any other column pattern.

These rules are the same as for an SEC-DED H-matrix as given above with an additional constraint placed on the uniqueness of the columns. That is, not only must each column be unique, but also every possible rotation of the column must be unique.

For example, a column of one and only one "1" could be rotated from 1 to r−1 positions where each rotation would produce a different column pattern. However, two such columns would not be acceptable. For example, a column of 00100 and another column of 10000 would not be acceptable even though different since a two position rotation of 10000 duplicates the 00100 column. Neither would a column with an odd number of 1's and no 0's be acceptable since any rotation of such a column duplicates itself.

For an eight row S-matrix, permissable column patterns are those shown in Table 2 for any of their rotations. It should be noted that an eight row S-matrix cannot have more than sixteen columns.

TABLE 2

| 1 of 8 | 3 of 8 | 5 of 8 | 7 of 8 |
|---|---|---|---|
| 1 | 1 1 1 1 1 1 1 | 0 0 0 0 0 0 0 | 0 |
| 0 | 1 1 1 1 1 0 0 | 0 0 0 0 0 1 1 | 1 |
| 0 | 1 0 0 0 0 1 0 | 0 1 1 1 1 0 1 | 1 |
| 0 | 0 1 0 0 0 0 1 | 1 0 1 1 1 1 0 | 1 |
| 0 | 0 0 1 0 0 1 0 | 1 1 0 1 1 0 1 | 1 |
| 0 | 0 0 0 1 0 0 0 | 1 1 1 0 1 1 1 | 1 |
| 0 | 0 0 0 0 1 0 1 | 1 1 1 1 0 1 0 | 1 |
| 0 | 0 0 0 0 0 0 0 | 1 1 1 1 1 1 1 | 1 |

Intuitively, it would appear that given r rows and x number of 1's per column, then the integer portion of the expression $(r-1)!/x!(r-x)!$ denotes the number of acceptable columns having x1's. The expression $r!/x!(r-x)!$ denotes the number of combinations of x1's in r bits which, if divided by r, yields the expression $(r-1)!/x!(r-x)!$.

The choice of which of the possible column patterns are used for the matrix is arbitrary except for one, the check bit. The S-matrix must contain a column with a single 1 which is to be reserved for the check bit. This rule allows the same parts to be symmetrically used for generation of the check bits as well as checking the code word.

After an S-matrix has been chosen, an H-matrix may be formed by a horizontal concatenation of the S-matrix with each of the r−1 vertical rotations of the S-matrix. The ordering of the concatonation is arbitrary just as is the ordering of the columns in the S-matrix. For example, given the S-matrix consisting of 8-rows, R(1:8), of 10 bits each, then the H-matrix might look like:

$$H = \begin{bmatrix} R1 & R2 & R3 & R4 & R5 & R6 & R7 & R8 \\ R2 & R3 & R4 & R5 & R6 & R7 & R8 & R1 \\ R3 & R4 & R5 & R6 & R7 & R8 & R1 & R2 \\ R4 & R5 & R6 & R7 & R8 & R1 & R2 & R3 \\ R5 & R6 & R7 & R8 & R1 & R2 & R3 & R4 \\ R6 & R7 & R8 & R1 & R2 & R3 & R4 & R5 \\ R7 & R8 & R1 & R2 & R3 & R4 & R5 & R6 \\ R8 & R1 & R2 & R3 & R4 & R5 & R6 & R7 \end{bmatrix} \quad (1)$$

The significance of the S-matrix approach to deriving the H-matrix is that 1 common LSI circuit can now be defined from the S-matrix. Each S-part is then particularized by rotating the assignment of parity syndrome bits to the S-part pins. This will become more apparent in the discussion of the S-part below.

It should be noted that the resulting H-matrix may contain more columns than needed. For example, it was previously stated that the same S-matrix would be used for an n=80, 79, 78, 77, 76, 75, 74 or 73. Thus, for an n of 73, the above H-matrix has seven extra columns. The extra columns can be assigned to the null operator (i.e. the constant "0") rather than to a data or check bit. In general, any smaller code word can be assigned to a larger H-matrix by nulling the extra columns.

It also should be noted that in certain instances it will not be possible to find enough columns which will satisfy the rules for generating the S-matrix. This occurs whenever there is insufficient redundancy to cover those column codes which are rejected because upon rotation they duplicate themselves.

For example, 11 data bits require 5 check bits for an SEC-DED code word. The total number of bits is sixteen and therefore $n/r = 16/5 = 31/5$ which means that the number of S-matrix columns must be $m = 4$. However, there are only three classes of column patterns of 5 bits which satisfy the rules set forth earlier. These are the following or any of their rotations:

| 1 of 5 | 3 of 5 |
|--------|--------|
| 1      | 1 1    |
| 0      | 1 1    |
| 0      | 1 0    |
| 0      | 0 1    |
| 0      | 0 0    |

Another column which satisfies all the criteria except that it duplicates itself on rotation is the all 1's column 11111. However, it can be observed that a three column S-matrix rotated five times will be only one short of the required number of code bits needed; i.e. it could be satisfied by one usage of an all 1's column. Therefore, the solution to the problem is to allow the addition of those columns to the S-matrix which satisfy all the criteria except that of duplicating itself on rotation. When this restricted S-matrix is rotated to form the H-matrix, the resultant H-matrix will have a number of duplicate columns because of the non-conforming S-matrix column. Only one of these can be assigned to a data bit. The others must be given a null assignment. Therefore, the 5×4 S-matrix with the restricted column might be $$S = \begin{bmatrix} 1 & 1 & 1 & 1 \\ 0 & 1 & 1 & 1 \\ 0 & 1 & 0 & 1 \\ 0 & 0 & 1 & 1 \\ 0 & 0 & 0 & 1 \end{bmatrix} \quad (2)$$

and the resulting H-matrix:

$$H = \begin{bmatrix} c_1 & d_1 & d_2 & \text{"0"} & c_2 & d_3 & d_4 & \text{"0"} & c_3 & d_5 & d_6 & \text{"0"} & c_4 & d_7 & d_8 & \text{"0"} & c_5 & d_9 & d_{10} & d_{11} \\ 1 & 1 & 1 & 1 & 0 & 0 & 0 & 1 & 0 & 0 & 1 & 1 & 0 & 1 & 0 & 1 & 0 & 1 & 1 & 1 \\ 0 & 1 & 1 & 1 & 1 & 1 & 1 & 1 & 0 & 0 & 0 & 1 & 0 & 0 & 1 & 1 & 0 & 1 & 0 & 1 \\ 0 & 1 & 0 & 1 & 0 & 1 & 1 & 1 & 1 & 1 & 1 & 1 & 0 & 0 & 0 & 1 & 0 & 0 & 1 & 1 \\ 0 & 0 & 1 & 1 & 0 & 1 & 0 & 1 & 0 & 1 & 1 & 1 & 1 & 1 & 1 & 1 & 0 & 0 & 0 & 1 \\ 0 & 0 & 0 & 1 & 0 & 0 & 1 & 1 & 0 & 1 & 0 & 1 & 0 & 1 & 1 & 1 & 1 & 1 & 1 & 1 \end{bmatrix}$$

FIG. 1 is a functional diagram of a large scale integrated S-part. The arrangement includes a set of parity trees 2 for generating the parity of each row defined by the S-matrix. Each parity generator 2 has as inputs the m-code bits (uncorrected). The parity generators perform an exclusive OR function of those code bits marked by a 1 in each row of the S-Matrix.

An r-input parity tree 4 combines a different numbered row, one from each of the S-parts, to form a syndrome bit of the H-matrix on a check operation or 1 check bit on a generate operation. The parity tree or syndrome generator 4 has coupled to its inputs the outputs of the row power generators 2.

A set of r to 1 decoders 6 receive the r-syndrome bits (rotated), and check the H-matrix syndrome code appropriate to each column of the S-matrix. The syndrome inputs must be rotated according to the rotation of the S-matrix used to form the corresponding sector of the H-matrix. Finally, a set of switches 8 select a compliment or true value of each data bit depending upon whether the corresponding column code is or is not detected. The switches 8 have inputs coupled to decoders 6 and the m uncorrected code bits and produce at their output m corrected code bits. Further, OR function 10 has inputs coupled to the outputs of the m-decoders 6 for generating an indication of correction.

It should be noted that FIG. 1 is given as an example of the form which an LSI S-part might take. A number of variations and additons to this will be discussed below.

In order to minimize the parity trees for generating the S-matrix row parities, the columns for the S-matrix should be selected on the basis of the minimum number of 1's per row. That is, all the triple 1's columns should be exhausted before using columns with a higher number of 1's. Then the selection should be made from the available five 1's columns, and so on. One such arrangement for an 8 by 10 S-matrix is

|   | c | $b_0$ | $b_1$ | $b_2$ | $b_3$ | $b_4$ | $b_5$ | $b_6$ | $b_7$ | $b_8$ |   |
|---|---|---|---|---|---|---|---|---|---|---|---|
|   | 1 | 1 | 1 | 1 | 1 | 1 | 1 | 1 | 0 | 0 |   |
|   | 0 | 1 | 1 | 1 | 1 | 1 | 0 | 0 | 0 | 0 |   |
|   | 0 | 1 | 0 | 0 | 0 | 0 | 1 | 0 | 0 | 1 |   |
| S = | 0 | 0 | 1 | 0 | 0 | 0 | 1 | 1 | 1 | 0 | (3) |
|   | 0 | 0 | 0 | 1 | 0 | 0 | 1 | 0 | 1 | 1 |   |
|   | 0 | 0 | 0 | 0 | 1 | 0 | 0 | 0 | 1 | 1 |   |
|   | 0 | 0 | 0 | 0 | 0 | 1 | 0 | 1 | 1 | 1 |   |
|   | 0 | 0 | 0 | 0 | 0 | 0 | 0 | 0 | 1 | 1 |   |

This is just one of many possible arrangements which has 32 "1s" which is the minimum possible for this matrix. The next step is to rotate the columns to obtain a minimum number of 1's per row. This should be $32/8 = 4$. Columns $b_0, b_7$, $b_1$ $b_8$ are complementary and need not be rotated. The problem is then reduced to rotating columns $b_2$ through $b_6$ and the check bit column c so that no more than two 1's appear in any one of the remaining rows. A minimum parity row 10×8 S matrix might be

| $b_0$ | $b_7$ | $b_1$ | $b_8$ | $b_2$ | $b_3$ | $b_4$ | $b_5$ | $b_6$ | c |   |
|---|---|---|---|---|---|---|---|---|---|---|
| 1 | 0 | 1 | 0 | 1 | 0 | 0 | 1 | 0 | 0 | $P1 = b_0 \oplus b_1 \oplus b_2 \oplus b_5$ |
| 1 | 0 | 1 | 0 | 1 | 0 | 0 | 0 | 0 | 1 | $P2 = b_0 \oplus b_1 \oplus b_2 \oplus c$ |
| 1 | 0 | 0 | 1 | 0 | 1 | 0 | 0 | 0 | 1 | $P3 = b_0 \oplus b_3 \oplus b_6 \oplus b_8$ |
| 0 | 1 | 1 | 0 | 0 | 1 | 1 | 0 | 0 | 0 | $P4 = b_1 \oplus b_3 \oplus b_4 \oplus b_7$ (4) |
| 0 | 1 | 0 | 1 | 1 | 0 | 0 | 1 | 0 | 0 | $P5 = b_2 \oplus b_5 \oplus b_7 \oplus b_8$ |
| 0 | 1 | 0 | 1 | 0 | 0 | 1 | 0 | 1 | 0 | $P6 = b_4 \oplus b_6 \oplus b_7 \oplus b_8$ |
| 0 | 1 | 0 | 1 | 0 | 0 | 1 | 1 | 0 | 0 | $P7 = b_4 \oplus b_5 \oplus b_7 \oplus b_8$ |
| 0 | 1 | 0 | 1 | 0 | 1 | 0 | 0 | 0 | 1 | $P8 = b_3 \oplus b_6 \oplus b_7 \oplus b_8$ |
|   |   |   |   |   |   |   |   |   |   | byte parity $= P1 \oplus P6 \oplus b3$ |

Where $\oplus$ denotes exclusive-OR

An alternative to the minimum parity row S-matrix is to minimize the number of rows for which parity has to be generated. That is, it is readily apparent that a row of all 0s can be obtained by rotating the last two columns. One advantage of this is that it eliminates one of the row parity trees, and perhaps more importantly it eliminates a row parity pin on the LSI package. The second advantage of having an all 0 row is that it could be eliminated for a seven row S-matrix with, of course, the elimination of some columns that would no longer be unique. This would permit the LSI part to be used for smaller word sizes requiring only seven check bits instead of eight, for example, on 32 or 36 bit data words.

The zero row 10×8 S-matrix may be constructed by first constructing a 7 row S-matrix.

$$S = \begin{bmatrix} 1 & 1 & 1 & 1 & 1 & 1 & 1 & 1 \\ 0 & 1 & 1 & 1 & 1 & 0 & 1 & 0 \\ 0 & 1 & 0 & 0 & 0 & 1 & 1 & 1 \\ 0 & 0 & 1 & 0 & 0 & 0 & 1 & 1 \\ 0 & 0 & 0 & 1 & 0 & 1 & 1 & 1 \\ 0 & 0 & 0 & 0 & 1 & 0 & 0 & 1 \\ 0 & 0 & 0 & 0 & 0 & 0 & 0 & 0 \end{bmatrix} \quad (5)$$

This S-matrix may then be made into a minimum parity row S-matrix by rotating columns.

$$S = \begin{bmatrix} 0 & 1 & 0 & 1 & 0 & 1 & 0 & 0 \\ 0 & 1 & 0 & 1 & 0 & 0 & 0 & 1 \\ 0 & 1 & 1 & 0 & 0 & 1 & 1 & 0 \\ 0 & 0 & 1 & 0 & 1 & 0 & 1 & 1 \\ 0 & 0 & 0 & 1 & 0 & 1 & 1 & 1 \\ 0 & 0 & 1 & 0 & 1 & 0 & 1 & 1 \\ 1 & 0 & 0 & 0 & 1 & 0 & 1 & 1 \end{bmatrix} \quad (6)$$

An all 0 row and two additional columns are added to the 8×7 S-matrix to get the desired 10×8 S-matrix giving an S-matrix shown below.

$$S = \begin{bmatrix} c & b_0 & b_1 & b_2 & b_3 & b_4 & b_5 & b_6 & b_7 & b_8 \\ 0 & 1 & 0 & 1 & 0 & 1 & 0 & 0 & 0 & 1 \\ 0 & 1 & 0 & 1 & 0 & 0 & 0 & 1 & 1 & 0 \\ 0 & 1 & 1 & 0 & 0 & 1 & 1 & 0 & 0 & 0 \\ 0 & 0 & 1 & 0 & 1 & 0 & 1 & 1 & 0 & 1 \\ 0 & 0 & 0 & 1 & 0 & 1 & 1 & 1 & 1 & 0 \\ 0 & 0 & 1 & 0 & 1 & 0 & 1 & 1 & 1 & 0 \\ 1 & 0 & 0 & 0 & 1 & 0 & 1 & 1 & 0 & 1 \\ 0 & 0 & 0 & 0 & 0 & 0 & 0 & 0 & 0 & 0 \end{bmatrix} \begin{array}{l} P1 = b_0 \oplus b_2 \oplus b_4 \oplus b_8 \\ P2 = b_0 \oplus b_2 \oplus b_6 \oplus b_7 \\ P3 = b_0 \oplus b_1 \oplus b_4 \oplus b_5 \\ P4 = b_1 \oplus b_3 \oplus b_5 \oplus b_6 \oplus b_8 \\ P5 = b_2 \oplus b_4 \oplus b_5 \oplus b_6 \oplus b_7 \\ P6 = b_1 \oplus b_3 \oplus b_5 \oplus b_6 \oplus b_7 \\ P7 = b_3 \oplus b_5 \oplus b_6 \oplus c_7 \oplus b_8 \\ P8 = 0 \end{array} \quad (7)$$

Byte parity = P1 ⊕ P6

The syndrome bits for an 8 check bit code word (up to 72 data bits) are given by the "H" matrix ((1) above) and are:

S1 = P11⊕P22⊕P33⊕P44⊕P55⊕P66⊕P77⊕0

S2 = P21⊕P32⊕P43⊕P54⊕P65⊕P76⊕0⊕P18

S3 = P31⊕P42⊕P53⊕P64⊕P54⊕0⊕P17⊕P28

S4 = P41⊕P52⊕P63⊕P74⊕0⊕P16⊕P27⊕P38

S5 = P51⊕P62⊕P73⊕0⊕P15⊕P26⊕P37⊕P48

S6 = P61⊕P72⊕0⊕P14⊕P25⊕P36⊕P47⊕P58

S7 = P71⊕0⊕P13⊕P24⊕P35⊕P46⊕P57⊕P68

S8 = 0⊕P12⊕P23⊕P34⊕P45⊕P56⊕P67⊕P78 where Pij represents the ith row parity of the jth S-part. The above defines the wiring between the S-part row parity outputs and the syndrome parity generators. For a 7 check bit code word (up to 49 data bits) the syndromes are:

S1 = P11⊕P22⊕P33⊕P44⊕P55⊕P66⊕P77

S2 = P21⊕P32⊕P43⊕P54⊕P65⊕P76⊕P17

S3 = P31⊕P42⊕P53⊕P64⊕P75⊕P16⊕P27

S4 = P41⊕P52⊕P63⊕P74⊕P15⊕P26⊕P37

S5 = P51⊕P62⊕P73⊕P14⊕P25⊕P36⊕P47

S6 = P61⊕P72⊕P13⊕P24⊕P35⊕P46⊕P57

S7 = P71⊕P12⊕P23⊕P34⊕P45⊕P56⊕P67 where inputs $b_7$ and $b_8$ to the S-part must be set equal to zero. Here the same S-part is used as for the 8 check bit implementation with the only difference being in the wiring between the S-part and syndrome parity generators.

If there is no error in the data or check bits, the syndrome S will have a value of zero. If a single code word bit is in error, the syndrome or any of its rotations will match one of the columns of the S-matrix. If we define the vector X[j] as the syndrome inputs of the jth, S-part the relation between X[j] and the H-matrix syndrome, S is again derived from the H-matrix (1) as:

X[1] = S1, S8, S7, S6, S5, S4, S3, S2

X[2] = S2, S1, S4, S5, S6, S7, S8, S1

X[3] = S3, S2, S1, S6, S7, S8, S1, S2

X[4] = S4, S3, S6, S1, S8, S1, S2, S3

X[5] = S5, S4, S7, S8, S1, S2, S3, S4

X[6] = S6, S5, S8, S1, S2, S1, S4, S5

X[7] = S7, S6, S1, S2, S3, S4, S1, S6

X[8] = S8, S7, S6, S5, S4, S3, S2, S1

The above defines the wiring between the syndrome parity networks and the inputs to the correction decode circuit in the S-part.

The "X" vector inputs are then decoded according to the S-matrix columns. For example, the S-matrix (7) indicates that the data input, $b_0$, is to be complemented if input X1[j], X2[j] and X3[j] are 1's and the remaining X[j] inputs are zero. The correction circuitry is just an exclusive OR of the data bit with the output of the corresponding decode circuit.

If an external indication of which bit was corrected is desired, this can be done with an exclusive OR of the code word input and output from the S-part. Alternatively, the outputs of the decode circuits might be brought out of the S-part instead of the corrected data and the correction performed by exclusive OR gates external to the S-parts. The chip can also be designed such that either alternative can be used.

Figure 2:
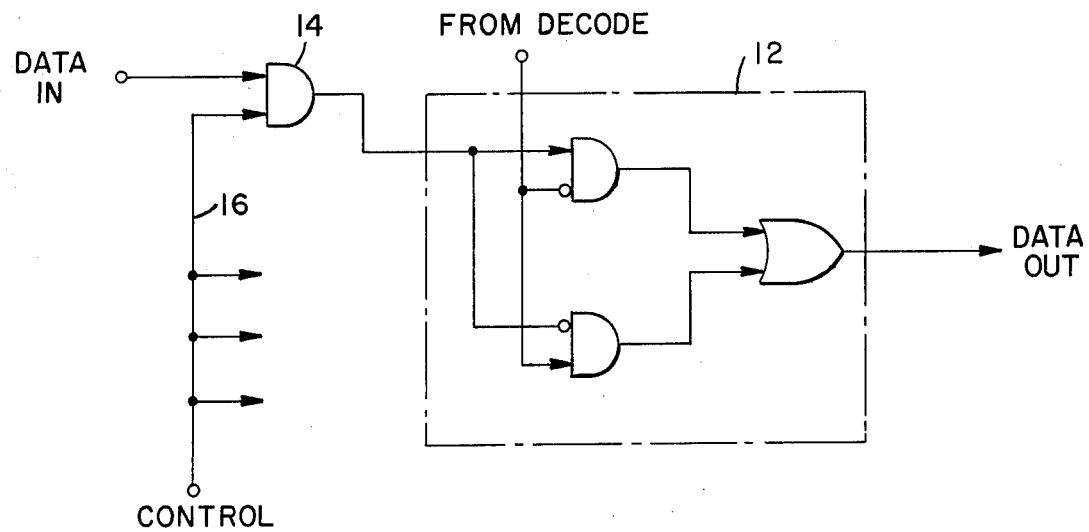
FIG. 2 is a diagram of an apparatus for indicating which bit was corrected.

Such an arrangement is shown in FIG. 2. The correction exclusive OR gate 12 is preceded with an AND gate 14 in the data path. The other input of AND gate 14 is a common control line 16 which would be "1" if the output is to be the corrected data or a "0" if the output is to be the correction decode output. The output of AND gate 14 is coupled to exclusive OR circuit 12. The second input to exclusive OR circuit 12 originates in the decode circuitry.

Still another alternative would be to code the 10 correction decode lines into a 4 line bit-position code with a fifth line to denote the sector of the code word to which this correction applies. This would eliminate five pins on the S-part, but would require that decode as well as correction circuitry be available externally to the S-part.

Whenever exactly two bits of the code word are in error, the syndrome will contain an even number of 1's. Also, any multiple of two bits in error will also produce a syndrome with an even number of 1's or a syndrome of all 0's. This is a property of always having an odd number of 1's in the H-matrix. Therefore, an even number of errors will never cause a miscorrection and all double errors will be detected. An odd number of errors greater than 1 may cause a miscorrection; i.e. produce the same syndrome as a single error. However, for the 80×8 H-matrix only 80 out of the 120 possible odd 1's combinations of 8 bits are used for correction, therefore, some multiple odd errors will be detected.

Figure 3:
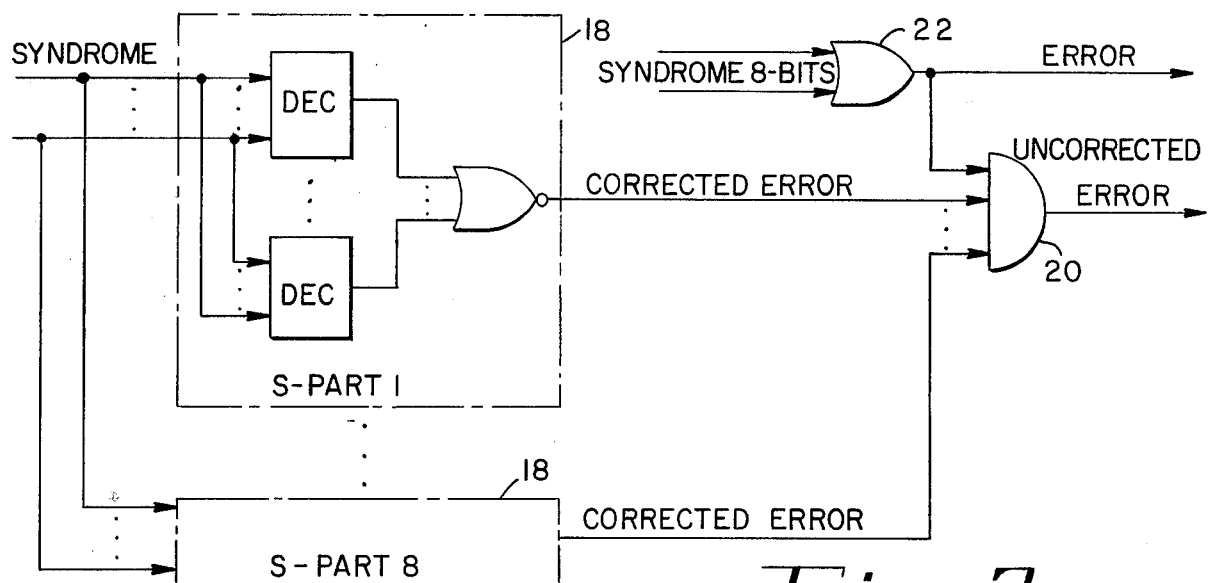
FIG. 3 is a block diagram of an apparatus having an output denoting whether a correctable error has been detected.

By ORing all the syndrome bits there is produced an output of 1 if any error, correctable or not, is detected. Referring to FIG. 3, each S-part 18 has the syndrome bits applied thereto and also has an output denoting whether a correctable error has been detected on any of the code bits entering the S-part. These are ANDed in AND gate 20 with the output of the syndrome OR gate 22 to produce an output denoting a detected, non-corrected multiple bit error. Alternatively, an even 1's detector could be built into the S-part, and a multiple odd error detection ignored since the probability of occurrence is very rare and most multiple odd errors when they do occur result in a miscorrection anyhow.

In many applications it is desired to generate a byte parity. Using the S-matrix (7), byte parity is given by the exclusive OR of the row 1 and row 6 parity outputs. If an error is detected in that byte, the byte parity is inverted. This can be done by an exclusive OR circuit internal or external to the S-part. Alternatively, the parity might be brought out instead of the corrected check bit. The chip can also be designed to allow the option of bringing either the check bit or byte parity bit out of the S-part.

Figure 4:
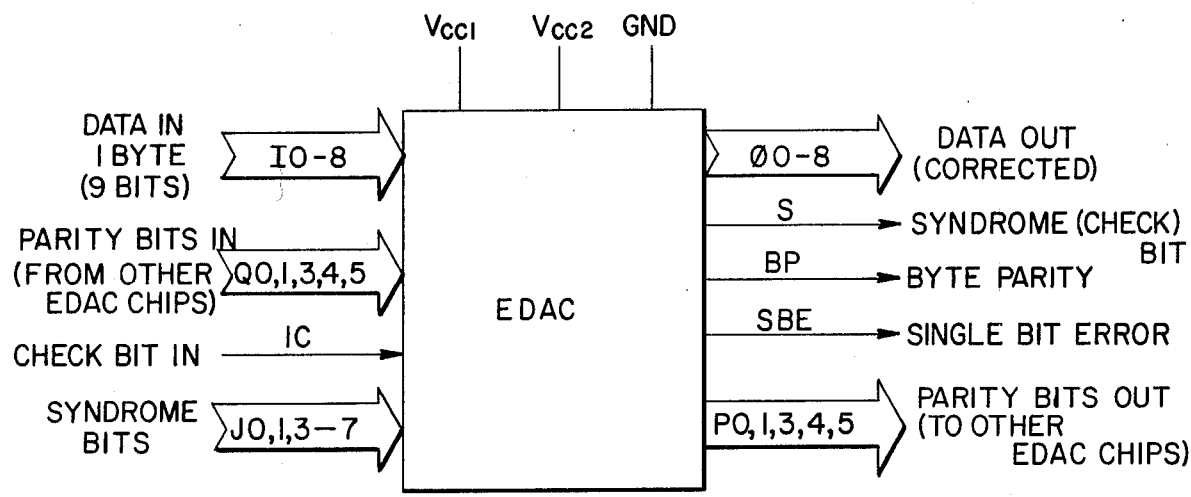
FIG. 4 is a block diagram showing inputs to and outputs from the error detection and correction (EDAC) apparatus according to the present invention.

FIG. 4 is a block diagram illustrating the inputs to and outputs from the error detection and correction (EDAC) apparatus according to the present invention. Each EDAC apparatus processes one byte of data shown in FIG. 4 as I0 through I8 and has one check bit input IC and one byte parity bit BP. Five intermediate sector matrix parity outputs (P0–P5) from each EDAC apparatus are connected to sector matrix parity inputs Q0–Q5 of other EDAC apparatus, as shown in Table 3. The intermediate sector matrix parity outputs from each of eight EDAC chips is shown in Table 4.

| Chip 0 | Chip 1 | Chip 2 | Chip 3 | Chip 4 | Chip 5 | Chip 6 | Chip 7 |
|---|---|---|---|---|---|---|---|
| $\overline{Q5}$ $\overline{P55}$ | $\overline{P56}$ | $\overline{P57}$ | $\overline{P50}$ | $\overline{P51}$ | $\overline{P52}$ | $\overline{P53}$ | $\overline{P54}$ |
| Q4 P46 | P47 | P40 | P41 | P42 | P43 | P44 | P45 |
| Q3 $\overline{P37}$ | $\overline{P30}$ | $\overline{P31}$ | $\overline{P32}$ | $\overline{P33}$ | $\overline{P34}$ | $\overline{P35}$ | $\overline{P36}$ |
| Q1 $\overline{P11}$ | $\overline{P12}$ | $\overline{P13}$ | $\overline{P14}$ | $\overline{P15}$ | $\overline{P16}$ | $\overline{P17}$ | $\overline{P10}$ |
| Q0 P02 | P03 | P04 | P05 | P06 | P07 | P00 | P01 |

| Chip 0 | Chip 1 | Chip 2 | Chip 3 | Chip 4 | Chip 5 | Chip 6 | Chip 7 |
|---|---|---|---|---|---|---|---|
| $\overline{P50}$ | $\overline{P51}$ | $\overline{P52}$ | $\overline{P53}$ | $\overline{P54}$ | $\overline{P55}$ | $\overline{P56}$ | $\overline{P57}$ |
| $\overline{P40}$ | $\overline{P41}$ | $\overline{P42}$ | $\overline{P43}$ | $\overline{P44}$ | $\overline{P45}$ | $\overline{P46}$ | $\overline{P47}$ |
| $\overline{P30}$ | $\overline{P31}$ | $\overline{P32}$ | $\overline{P33}$ | $\overline{P34}$ | $\overline{P35}$ | $\overline{P36}$ | $\overline{P37}$ |
| $\overline{P10}$ | $\overline{P11}$ | $\overline{P12}$ | $\overline{P13}$ | $\overline{P14}$ | $\overline{P15}$ | $\overline{P16}$ | $\overline{P17}$ |
| P00 | P01 | P02 | P03 | P04 | P05 | P06 | P07 |

Using the above described techniques, $$S = \begin{bmatrix} 0 & 0 & 0 & 0 & 0 & 0 & 0 & 0 & 0 \\ 0 & 0 & 0 & 0 & 0 & 0 & 0 & 0 & 0 \\ 0 & 1 & 1 & 1 & 1 & 0 & 1 & 1 & 1 \\ 0 & 1 & 1 & 1 & 1 & 1 & 1 & 1 & 0 \\ 0 & 1 & 0 & 0 & 1 & 0 & 0 & 1 & 0 \\ 1 & 0 & 1 & 0 & 1 & 0 & 1 & 0 & 1 \\ 0 & 0 & 0 & 1 & 1 & 0 & 0 & 1 & 1 \\ 0 & 0 & 0 & 0 & 0 & 1 & 1 & 1 & 1 & 0 \end{bmatrix}$$

(with column header: Check bit $R_0$ $R_1$ $R_2$ $R_3$ $R_4$ $R_5$ $R_6$ $R_7$ $R_8$)

Thus,

P0 = R4⊕R5⊕R6⊕R7

P1 = R2⊕R3⊕R6⊕R7

P2 = R1⊕R7⊕R3⊕R8⊕R5⊕CB

P3 = R0⊕R6⊕R3⊕R8

P4 = R0⊕R6⊕R1⊕R7⊕R2⊕R3⊕R4⊕R5

P5 = R0⊕R6⊕R1⊕R7⊕R2⊕R3⊕R4⊕R8

P6 = 0

P7 = 0

The R8 input above can be forced to zero for an 8-bit byte. p For the H-matrix;

| Byte 0 | Byte 1 | Byte 2 | Byte 3 | Byte 4 | Byte 5 | Byte 6 | Byte 7 |
|---|---|---|---|---|---|---|---|
| $\overline{P10}$ | P01 | 0 | 0 | P54 | P45 | P36 | P27 = S7 |
| P00 | 0 | 0 | P53 | P44 | P35 | P26 | $\overline{P17}$ = S6 |
| 0 | 0 | P52 | P43 | P34 | P25 | P16 | P07 = S5 |
| 0 | $\overline{P51}$ | P42 | P33 | P24 | P15 | P06 | 0 = S4 |
| P50 | P41 | P32 | P23 | P14 | P05 | 0 | 0 = S3 |
| $\overline{P40}$ | $\overline{P31}$ | $\overline{P22}$ | $\overline{P13}$ | P04 | 0 | 0 | $\overline{P57}$ = S2 |
| $\overline{P30}$ | $\overline{P21}$ | $\overline{P12}$ | P03 | 0 | 0 | $\overline{P56}$ | $\overline{P47}$ = S1 |
| $\overline{P20}$ | $\overline{P11}$ | P02 | 0 | 0 | $\overline{P55}$ | $\overline{P46}$ | $\overline{P37}$ = S0 |

Each of the EDAC parts will then produce the value of one syndrome bit S shown in FIG. 4. Seven of the eight syndrome outputs are connected to each of the EDAC syndrome input terminals (J0–J7) in FIG. 4, as shown in Table 5.

TABLE 5

| | Chip 0 | Chip 1 | Chip 2 | Chip 3 | Chip 4 | Chip 5 | Chip 6 | Chip 7 |
|---|---|---|---|---|---|---|---|---|
| J7 | $\overline{S5}$ | $\overline{S6}$ | $\overline{S7}$ | $\overline{S0}$ | $\overline{S1}$ | $\overline{S2}$ | $\overline{S3}$ | $\overline{S4}$ |
| J6 | $\overline{S4}$ | $\overline{S5}$ | $\overline{S6}$ | $\overline{S7}$ | $\overline{S0}$ | $\overline{S1}$ | $\overline{S2}$ | $\overline{S3}$ |
| J5 | $\overline{S3}$ | $\overline{S4}$ | $\overline{S5}$ | $\overline{S6}$ | $\overline{S7}$ | $\overline{S0}$ | $\overline{S1}$ | $\overline{S2}$ |
| J4 | $\overline{S2}$ | $\overline{S3}$ | $\overline{S4}$ | $\overline{S5}$ | $\overline{S6}$ | $\overline{S7}$ | $\overline{S0}$ | $\overline{S1}$ |
| J3 | $\overline{S1}$ | $\overline{S2}$ | $\overline{S3}$ | $\overline{S4}$ | $\overline{S5}$ | $\overline{S6}$ | $\overline{S7}$ | $\overline{S0}$ |
| J1 | $\overline{S7}$ | $\overline{S0}$ | $\overline{S1}$ | $\overline{S2}$ | $\overline{S3}$ | $\overline{S4}$ | $\overline{S5}$ | $\overline{S6}$ |
| J0 | $\overline{S6}$ | $\overline{S7}$ | $\overline{S0}$ | $\overline{S1}$ | $\overline{S2}$ | $\overline{S3}$ | $\overline{S4}$ | $\overline{S5}$ |

All of the inputs and outputs in FIG. 4 are implemented to accommodate 9 bit bytes. For 8 bit Bytes, anyone of the nine data bit inputs can be permanently wired to a logical 0 value and the corresponding output ignored.

Also shown in FIG. 4 are the various power supply inputs VCC1, VCC2 and grounds. Also a single bit error signal SBE is generated.

Figure 5:
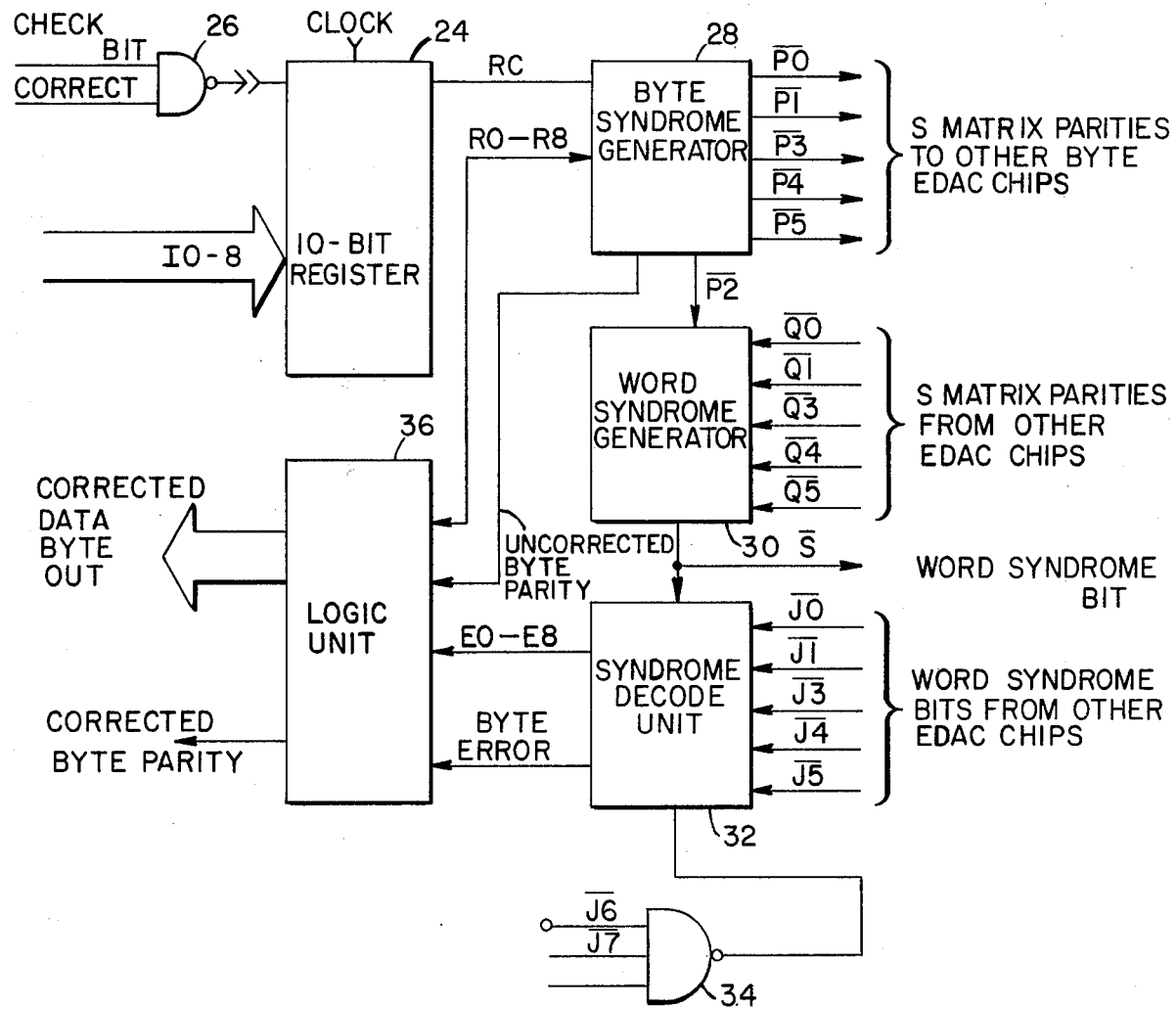
FIG. 5 is a more detailed block diagram of the apparatus of FIG. 4.

FIG. 5 is a more-detailed block diagram of the invention EDAC apparatus. The data bits I0-I8 are applied to inputs of a ten bit register 24. The check bit and the correct signal are applied to inputs of NAND gate 26 having an output which is likewise coupled to an input of register 24. Outputs RC and R0-R8 are applied to byte syndrome generator 28 which produce at its outputs the matrix parity outputs $\overline{P0}$, $\overline{P1}$, $\overline{P3}$, $\overline{P4}$ and $\overline{P5}$. These matrix parity outputs are applied to other byte EDAC chips. $\overline{P2}$ on the other hand is applied to word syndrome generator 30 as is shown in FIG. 5. Likewise applied to inputs of word syndrome generator 30 are the S-matrix parities from other byte EDAC chips. These are shown in FIG. 5 as $\overline{Q0}$, $\overline{Q1}$, $\overline{Q3}$, $\overline{Q4}$ and $\overline{Q5}$. The word syndrome bit produced by generator 30 is applied to syndrome decode unit 32 along with the word syndrome bits from other EDAC chips i.e. $\overline{J0}$, $\overline{J1}$, $\overline{J3}$, $\overline{J4}$ and $\overline{J5}$. The output of NAND gate 34 having $\overline{J6}$ and $\overline{J7}$ applied to its inputs is applied also to syndrome decode unit 32.

These outputs of syndrome decode unit 32, that is E0-E8, and the byte error signal are applied to logic unit 36 along with the uncorrected byte parity from byte syndrome generator 28 and the R0-R8 outputs from register 24. The outputs of logic unit 36 comprise the corrected data byte plus a corrected byte parity.

The implementation is optimized and will be described for use in an error detection and correction of binary words consisting of eight data bytes plus eight modified Hamming code bits where a byte may be either 8 or 9 bits. However, the EDAC part can also be used for other word lengths. While the application to be described is primarily for error detection and correction of information stored in computer mainframe memories, it may also be used to increase reliability of control stores, scratchpads, caches, datapads and peripheral equipment. The implementation provides for check bit generation or double error syndrome generation in approximately 20 nanoseconds and single bit error correction in about 40 nanoseconds.

Eight EDAC parts of the type shown in FIG. 5 can be innerconnected to (1) correct any single bit error within 72-64 data bits; (2) generate a unique one of eight codes to denote which one of the eight data bytes or associated check bits contains an error during single error correction; (3) generate a signal for each byte denoting whether the output byte has an odd or even parity value and (4) generate an eight bit syndrome which denotes a double or any even number of bits in error in the complete 72-80 bit word (data plus check bits) by any non-zero even parity value of the syndrome.

The same or duplicate of the eight innerconnected EDAC parts can also perform the encoding process; i.e. (1) generate the modified Hamming code check bits required for the error detection and correction process; and (2) test byte parity on each of the eight bytes doing check bit generation.

Figure 6:
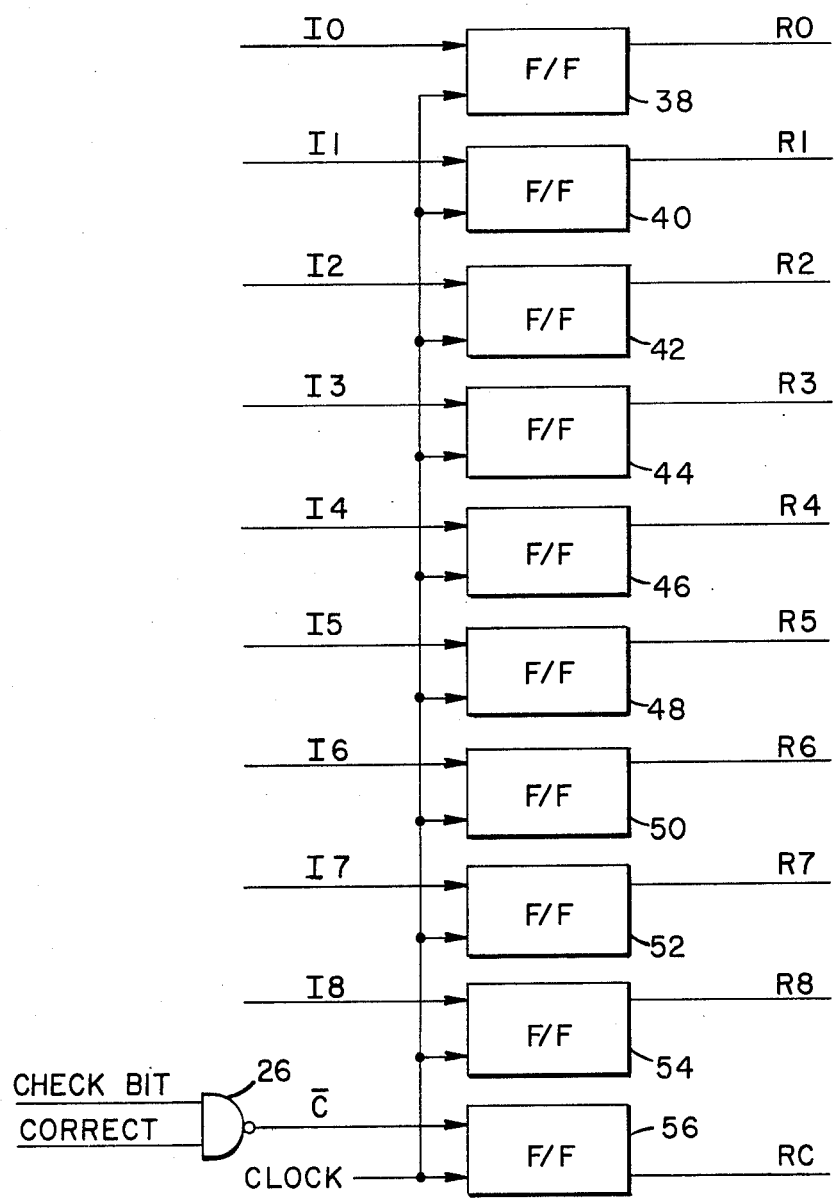
FIG. 6 is a logic diagram of the register shown in FIG. 5.

FIG. 6 is a logic diagram illustrating the contents of register 24 (FIG. 5). The bits of the data byte I0-I8 are each applied to an input of flip-flops 38, 40, 42, 44, 46, 48, 50, 52 and 54 respectively. A clock signal is likewise applied to each of these flip-flops and each generate a clocked data output R0-R8. An additional flip-flop 56 has the output of NAND gate 26 applied thereto along with the clock signal for producing the RC signal.

Figure 7:
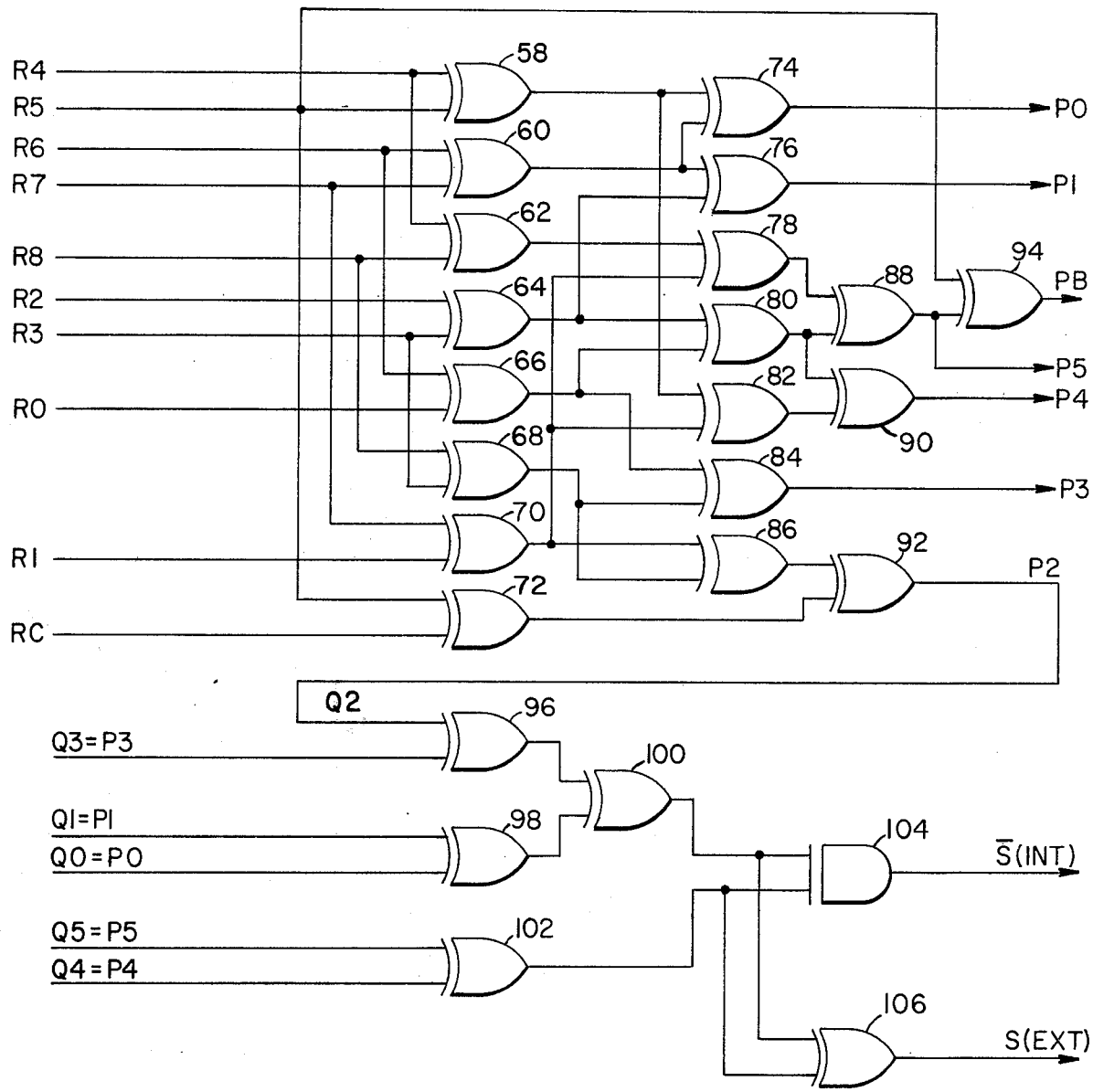
FIG. 7 is a logic diagram of the byte syndrome generator and word syndrome generator shown in FIG. 5.

The logic contained in byte syndrome generator 28 (FIG. 5) and word syndrome generator 30 (FIG. 5) is more clearly shown in FIG. 7. OR gate 58 has first and second inputs for receiving signals R4 and R5, and has an output which is coupled to one input of OR gates 74 and 82. OR gate 60 has first and second inputs coupled to R6 and R7 and an output which is applied to a second input of OR gate 74 and a first input of OR gate 76. The first and second inputs of OR gate 62 are applied to R4 and R8, and its output is applied to a first input of OR gate 78. Applied to the first and second inputs of OR gate 64 are the signals R1 and R3, and its output is applied to a second input of OR gate 76 and a first input of OR gate 80. OR gate 66 has a first input coupled to R3 and a second input coupled R0, and its output is coupled to a second input of OR gate 80. The output of OR gate 66 is likewise coupled to a first input of OR gate 84. OR gate 68 has inputs coupled to R3 and R8 and has an output which is coupled to a second input of OR gate 84 and a first input of OR gate 86. OR gate 70 has applied to its inputs R7 and R1, and its output is coupled to an input of OR gates 78 and 86. RC and R5 are coupled to the inputs of OR gate 72 having an output which is coupled to the input of OR gate 92.

The sector matrix parity output P0 and P1 are the outputs of OR gates 74 and 76 respectively likewise, the output of OR gate 84 produces the sector matrix parity signal P3.

The outputs of OR gates 78 and 80 are applied to inputs of OR gate 88 which produces at its output the second matrix parity signal P5. OR gate 90 has applied to its inputs, the outputs of OR gates 80 and 82 and produces at its output the sector matrix parity signal P4. The output of OR gate 86 is applied to a second input of OR gate 92 which produces at its output the sector matrix parity signal P2. Finally, OR gate 94 has a first input coupled to R5 and a second input coupled to the output of OR gate 88 (i.e. P5), and produces at its output the uncorrected byte parity bit PB.

Q2 and Q3 are applied to inputs of OR gate 96, Q1 and Q0 to inputs of OR gate 98, and Q4 and Q5 to inputs of OR gate 102. As stated previously, Q0, Q1, Q3, Q4 and Q5 are sector matrix parities from other byte EDAC chips. The outputs of OR gates 96 and 98 are applied to inputs of OR gate 100 having an output which is supplied to a first input of AND gate 104 and an input of OR gate 106. The output of OR gate 102 forms the second input of AND gate 104 and OR gate 106. The output of AND gate 104 forms the syndrome bit to be used internally, and the output of OR gate 106 forms the syndrome bit to be used on other EDAC chips.

Figure 8:
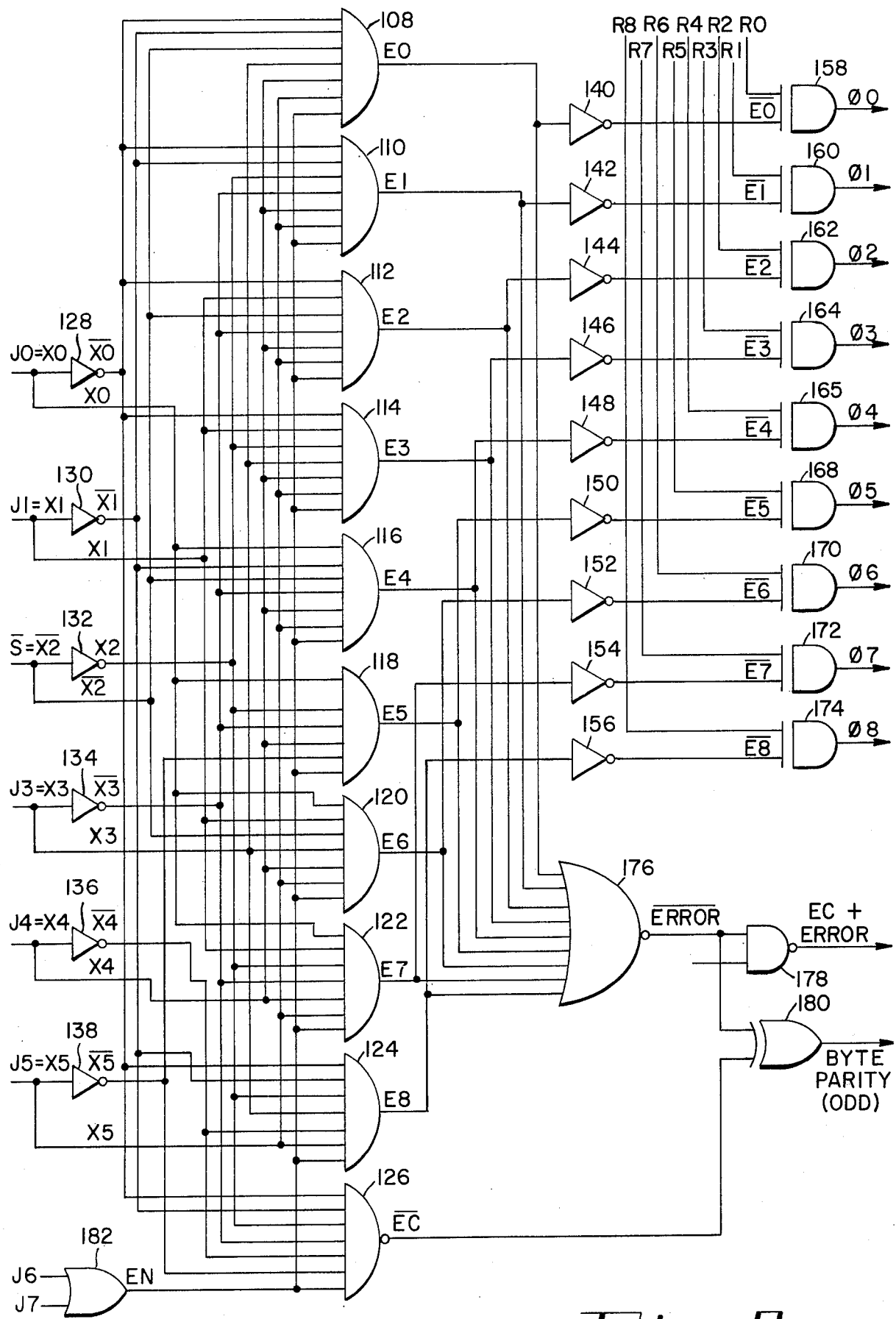
FIG. 8 is a logic diagram of the syndrome decode unit and logic unit of FIG. 5.

FIG. 8 illustrates the syndrome decode unit and logic unit 36 of FIG. 5 in more detail. NOR gate 182 has applied to its inputs syndrome outputs J6 and J7 and produces at its output an enable signal EN. Inverter 128 has J0 applied thereto and forms at its output $\overline{X0}$. Inverter 130 has J1 applied to its input and forms at its output $\overline{X1}$. Inverter 132 has applied to its input $\overline{S}$ from AND gate 104 (FIG. 7) and forms at its output X2. Likewise, $\overline{X3}$, $\overline{X4}$ and $\overline{X5}$ are produced by inverters 134, 136 and 138 respectively from J3, J4 and J5 respectively.

A plurality of seven input AND gates 108, 110, 112, 114, 116, 118, 120, 122 and 124 produce signals E0–E8 respectively. A seven input NAND gate 126 produces the signal $\overline{EC}$. Each of these AND gates has the enable signal generated by NOR gate 182 applied to one of its inputs. The remaining six inputs to each of these AND gates are coupled to the syndrome outputs as shown in FIG. 8 and Table 6.

TABLE 6

| AND 108 | AND 110 | AND 112 | AND 114 | AND 116 | AND 118 | AND 120 | AND 122 | AND 124 | AND 126 |
|---|---|---|---|---|---|---|---|---|---|
| $\overline{X0}$ | $\overline{X0}$ | $\overline{X0}$ | $\overline{X0}$ | X0 | X0 | X0 | X0 | $\overline{X0}$ | $\overline{X0}$ |
| $\overline{X1}$ | $\overline{X1}$ | X1 | X1 | $\overline{X1}$ | $\overline{X1}$ | $\overline{X1}$ | X1 | $\overline{X1}$ | $\overline{X1}$ |
| $\overline{X2}$ | X2 | $\overline{X2}$ | X2 | $\overline{X2}$ | X2 | $\overline{X2}$ | X2 | X2 | X2 |
| X3 | $\overline{X3}$ | $\overline{X3}$ | X3 | $\overline{X3}$ | $\overline{X3}$ | X3 | $\overline{X3}$ | X3 | $\overline{X3}$ |
| X4 | X4 | X4 | X4 | X4 | X4 | X4 | X4 | $\overline{X4}$ | $\overline{X4}$ |
| X5 | X5 | X5 | X5 | X5 | $\overline{X5}$ | X5 | X5 | X5 | $\overline{X5}$ |

Each of the outputs E0–E8 are applied to inputs of NOR gate 176 and are likewise each inverted by inverters 140, 142, 144, 146, 148, 150, 152, 154 and 156.

The output of NOR gate 176 is an $\overline{ERROR}$ signal and is applied to NAND gate 178 and OR gate 180. The signal $\overline{EC}$ is applied to the second input of NAND gate 178 to produce an EC+ERROR signal. The signal PB is applied to the second input of OR gate 180 to produce the corrected byte parity signal.

The corrected data byte out is produced as follows. AND gate 158 as applied to its inputs R0 and $\overline{E0}$ to produce O0. AND gate 160 has R1 and $\overline{E1}$ applied to its inputs to produce O1. O2 is likewise produced in AND gate 162 by the application of R2 and $\overline{E2}$, and O3 is produced by AND gate 164 having R3 and $\overline{E3}$ applied thereto. The remaining bits O4, O5, O6, O7 and O8 are similarly formed by AND gates 166, 168, 170, 172 and 174.

What is claimed is:

1. An apparatus for performing error correction and detection of binary words, said apparatus having a plurality of sections, each section processing one byte of data and comprising:
    first means for receiving raw data;
    second means coupled to said first means for producing a first plurality of intermediate sector matrix parity outputs;
    third means coupled to said second means for receiving one of said first plurality of outputs and a second plurality of intermediate matrix parity outputs from other sections and generating therefrom a syndrome signal; and
    fourth means coupled to said first and third means for receiving said syndrome signal and a plurality of syndrome signals from other sections and generating therefrom the corrected data bits.

2. An apparatus according to claim 1 wherein said first means comprises a plurality of clocked flip-flops each one of which has applied to its input one bit of raw data.

3. An apparatus according to claim 1 wherein said fourth means includes a plurality of coincidence gates each one receiving preselected combinations of said syndrome signals and generating therefrom a plurality of output signals which are combined with outputs of said first means to produce the corrected data bits.

4. An apparatus according to claim 3 further including fifth means coupled to the outputs of said plurality of coincidence gates for generating an error signal.

5. An apparatus according to claim 4 further including sixth means coupled to said fifth means for generating a byte parity signal.

* * * * *